(12) United States Patent
Usami

(10) Patent No.: US 6,984,875 B2
(45) Date of Patent: Jan. 10, 2006

(54) SEMICONDUCTOR DEVICE WITH IMPROVED RELIABILITY AND MANUFACTURING METHOD OF THE SAME

(75) Inventor: Tatsuya Usami, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/765,094

(22) Filed: Jan. 28, 2004

(65) Prior Publication Data

US 2004/0183164 A1 Sep. 23, 2004

(30) Foreign Application Priority Data

Jan. 28, 2003 (JP) .............................. 2003-019411

(51) Int. Cl.
*H01L 23/58* (2006.01)
(52) U.S. Cl. ...................... 257/642; 257/635; 257/741; 257/750; 438/597; 438/689; 438/710
(58) Field of Classification Search ................ 257/642, 257/635, 632, 629, 734, 741, 750, 762; 438/584, 438/597, 687, 689, 706, 707, 710, 725
See application file for complete search history.

(56) References Cited

U.S. PATENT DOCUMENTS 6,051,508 A * 4/2000 Takase et al. ................ 437/724
2001/0017422 A1 * 8/2001 Oda ........................... 257/768

FOREIGN PATENT DOCUMENTS

| JP | 11-87502 | 3/1999 |
| JP | 2000-294634 | 10/2000 |
| JP | 2001-326222 | 11/2001 |
| JP | 2002-110644 | 4/2002 |
| JP | 2002-246383 | 8/2002 |
| JP | 2003-17561 | 1/2003 |
| JP | 2003-533025 | 11/2003 |

OTHER PUBLICATIONS

Andrews, "Polysiloxane Modifications", Protective Coatings Worldwide, http://www.international-pc.com/pc/Focus_markets/tech_papers/polysiloxane_modifications_AFW_nov03.pdf , Nov. 2003.*

* cited by examiner

*Primary Examiner*—Evan Pert
*Assistant Examiner*—Scott R. Wilson
(74) *Attorney, Agent, or Firm*—Young & Thompson

(57) ABSTRACT

A semiconductor device includes an insulating layer, a conducting portion, and a modified layer. The insulating layer is formed on a semiconductor substrate. The conducting portion is formed in the insulating layer. The modified layer is formed between the insulating layer and the conducting portion. The insulating layer includes hydrogenated polysiloxane. The modified layer is a layer to which the hydrogenated polysiloxane is modified. A portion of the modified layer far from the semiconductor substrate may be thicker than a portion of the modified layer near the semiconductor substrate.

18 Claims, 9 Drawing Sheets

SEMICONDUCTOR DEVICE WITH IMPROVED RELIABILITY AND MANUFACTURING METHOD OF THE SAME

BACKGROUND OF THE INVENTION

1. Field of the Invention

The present invention relates to a semiconductor device and a manufacturing method of the same. More particularly, the present invention relates to a semiconductor device of which reliability is improved and a manufacturing method of the same.

2. Description of the Related Art

Recently, the request for high speed signal processing in LSI has been increasing year by year. A signal processing speed of the LSI mainly depend on operating speeds of its transistors and delay time of signal transmission in interconnections (wiring). The working speed of the transistor has been increasing by reducing its size. However, in the LSI based on a design rule of less than 0.25 micrometer, the influence of the delay of signal transmission in the interconnections has been increasing on the signal processing speed in the LSI, especially in the LSI having multilayer interconnections. Conventionally, to improve the delay of signal transmission, copper (Cu) has been substituting for aluminum (Al) as a material used for the interconnection. Also, low dielectric constant film has been substituting for silicon dioxide as a material used for an interlayer insulating film (an interlayer dielectric).

The low dielectric constant film is mainly categorized by two kinds of material groups. One group includes Si—O basis materials. Another group includes organic resin basis materials. As for the Si—O basis materials, a methylpolysiloxane film with the Si—O with methyl radicals as organic radicals and a methyl silsesquioxane (hereinafter referred to as a MSQ) film are known as insulating films. The film made from the organic resin basis materials is inferior to that made from the Si—O basis materials in its mechanical strength and dielectric characteristics. Therefore, it is difficult to integrate multilayer interconnections and obtain a high reliability by using the organic resin basis materials rather than using the Si—O basis materials. Hence, it is difficult to realize an advanced device with multilayer interconnections by using the organic resin basis materials.

Here, the conventional example will be described that the device using the MSQ film which is one of the Si—O basis materials with high mechanical strength and reliability will be described. FIG. 1 is a cross sectional view showing a conventional semiconductor device.

In FIG. 1, a first SiCN film 202 is formed as a barrier insulating film on an insulating film 201 formed on a semiconductor substrate that includes transistors. A MSQ film 213, which is one of an organo-polysiloxane film, is formed on the first SiCN film 202. A SiO2 film 204 is formed on the MSQ film 213. The trenches for the interconnections are formed through the first SiCN film 202, MSQ film 213 and the SiO2 film 204. A MSQ modified film 215 is formed in the side wall of the trench. The MSQ modified film 215 is formed by exposing the MSQ film 213 in oxygen plasma when the ashing processing is carried out to the trenches (described in Japanese Laid Open Patent Application (JP-A 2002-246383)). The MSQ modified film 215 is characterized by that the film thickness of the upper part is substantially the same as that of the lower part.

A TaN film 206 is formed as one of barrier metals on the inner surface of the trench. A Ta film 207 is formed as another barrier metal on the TaN film 206. A Cu film 208 is formed on the Ta film 207 such that the Cu film 208 fill up the trench. The interconnection is composed of the TaN film 206, the Ta film 207 and the Cu film 208. A second SiCN film 209 is formed as a barrier insulating film on the SiO2 film 204 and the interconnections. Here, the trench only for interconnection is illustrated. However, repetition to form a via on the trench and another interconnection on the via enables to form the multilayer interconnections. The trench has taper shape, the width of the upper part tends to be wider than that of the lower part. Therefore, the interval between the adjacent interconnections of the upper part is closer than that of the lower part. This causes that the electric field is concentrated at the upper part of the interconnections, which may bring about dielectric breakdown.

The MSQ modified film includes smaller amount of carbon element than the MSQ film and its composition is close to SiO2. The etching rate by buffered hydrogen fluoride of the MSQ modified film solution is faster than that of the MSQ film. Therefore, it is easy to confirm the MSQ modified film and the MSQ film by observing the SEM cross sectional view of the semiconductor device after the etching.

Next, the conventional manufacturing method of the semiconductor device will be described with reference to the drawings. FIGS. 2A to 2C and FIGS. 3A and 3B are the cross sectional views showing the procedure of the conventional manufacturing method of the semiconductor device.

Firstly, As shown in FIG. 2A, the first SiCN film 202 is formed by using the plasma CVD method on the insulating film 201 formed on the semiconductor substrate. The thickness of the first SiCN film 202 is 50 nm to 100 nm. Next, the material of the MSQ film 213 is coated and baked on the first SiCN film 202 such that the MSQ film 213 is formed with the film thickness of 150 nm to 350 nm. Then, the $SiO_2$ film 204 with the thickness of 50 nm to 200 nm is formed by using the plasma CVD method on the MSQ film 213.

Next, as shown in FIG. 2B, an ARC (anti-reflection coating) film 212 is coated on the $SiO_2$ film 204. Then, the photoresist mask 216 patterned by using the photolithography technique with the lower limit of 0.14-micrometer level.

After that, as shown in FIG. 2C, the dry etching processing is carried out to ARC film 212, the $SiO_2$ film 204 and the MSQ film 213 through the photoresist mask 216 by using gas including $CHF_3$. The dry etching is stopped at the surface of the first SiCN film 202. Next, the photoresist mask 216 is removed by oxygen plasma ashing. After that, residual is completely removed by using the organic remover with amine related material. Then, the first SiCN film 202 is etched back to be removed. As a result, the trench 220 is formed in the $SiO_2$ film 204, the MSQ film 213 and the first SiCN film 202. In this case, the MSQ modified film 215 is formed on the side wall of the trench 220. The MSQ modified film 215 is characterized by that the film thickness of the upper part is substantially the same as that of the lower part. Here, the film thickness of the upper part and the lower part is approximately less than 10 nm.

Next, as shown in FIG. 3A, after the outgassing process and the RF etching process by using Ar ions are carried out, the TaN film 206 with the thickness of 10 nm is formed as one of barrier metals on the inner surface of the trench 220. The Ta film 207 with the thickness of 20 nm is formed as another barrier metal on the TaN film 206. After that, the Cu seed film (not shown) with the thickness of 100 nm is formed on the Ta film 207. Next, the Cu film 208 with the thickness of 600 nm is formed on the Cu seed film by using Cu metal plating. Then, the semiconductor device is annealed in a furnace in the temperature range of 200 to 400 degrees Celsius.

After that, as shown in FIG. 3B, the metals (the TaN film 206, the Ta film 207 and the Cu film 208) are removed except for those in the trench 220 by using CMP (chemical mechanical polishing) technique. Then, the second SiCN film 209 with the thickness of 50 to 100 nm is formed by using the plasma CVD method on the $SiO_2$ film 204 and the interconnections.

The MSQ film has mechanical strength lower than $SiO_2$ by one order of magnitude. Therefore, heavy load generated by the CMP processing and the wire bonding processing brings about the film peeling of the MSQ film 213.

The MSQ film has low dielectric breakdown voltage. Particularly, the interval between the upper parts of adjacent interconnections is shorter than that between the lower parts. This makes interlayer insulating film corresponding to the upper parts of the interconnections weak in its dielectric breakdown strength in case of using the MSQ film. Especially, in case that the $SiO_2$ as a hard mask on the low dielectric constant film is etched by the erosion in the CMP processing, the SiCN film as a cap film is formed almost directly on the low dielectric constant film. This causes that the concentration of electric field becomes remarkably high near the boundary of the SiCN film and the low dielectric constant film. Therefore, the dielectric breakdown voltage of the interconnections is reduced and the dielectric breakdown might occur. It generates the problem of the decrease of the reliability of the semiconductor device.

In conjunction with the above description, Japanese Laid Open Patent Application JP-A 2002-246383 discloses the following a forming method of an insulating film and a manufacturing method of a semiconductor device. The forming method of an insulating film includes: preparing a solution by dissolving a first polymer and a second polymer to a solvent, each of the polymers includes mainly methylpolysiloxane and an average molecular weight of one of the polymers has more than ten times larger than that of another; and forming a coating film by coating the solution on a semiconductor substrate; and an organic silicon oxide film by thermally polymerizing the first polymer and the second polymer.

Also, Japanese Laid Open Patent Application JP-A 2003-17561 discloses the following a manufacturing method of a semiconductor device and a semiconductor device. This manufacturing method of a semiconductor device includes: forming a first isolating film made from low dielectric constant material with carbon on a semiconductor substrate; forming a low carbon concentration layer in a surface of the first insulating film by processing the surface to reduce the carbon concentration of the surface; forming a second insulating film on the low carbon concentration layer; forming a trench in the first and second insulating film for metal to be embedded; embedding the metal in the trench in the insulating films; and forming a interconnection by polishing a surface of the embedded metal.

Also, Japanese Laid Open Patent Application JP-A 2001-326222 discloses the following a semiconductor device, a semiconductor wafer and a manufacturing method of the same. This semiconductor device includes a multilayer insulating film having interconnections on a semiconductor substrate. The multilayer insulating film includes a first insulating film made from an organic lower dielectric constant material than silicon dioxide, a second insulating film made from a polysiloxane compound with Si—H group formed on the first insulating film, a third insulating film made from an inorganic material formed on the second insulating film.

Also, Japanese Laid Open Patent Application JP-A 2000-294634 discloses the following a semiconductor device and a manufacturing method of the same. This semiconductor device includes a plurality of interconnections on a substrate, wherein metals are placed between the interconnections. An inorganic insulating film is arranged at the side wall faced to adjacent interconnection.

Also, Japanese Laid Open Patent Application JP-A Heisei 11(1999)-87502 discloses the following a manufacturing method of a semiconductor device. This manufacturing method of a semiconductor device includes: forming a first insulating film on a substrate having a first interconnection layer; forming a second insulating film on the first insulating film and a third insulating film on the second insulating film, sequentially; forming a first resist pattern having an opening pattern corresponding to the a connection hole for the first interconnection on the third insulating film; transferring the pattern of the first resist pattern to the third insulating film by selectively etching the third insulating film while using the first resist pattern as a mask and the second insulating film as an anti-etching mask for the first insulating film; and removing the first resist pattern by using the second insulating film as a protect mask for the first insulating film.

SUMMARY OF THE INVENTION

Therefore, an object of the present invention is to provide a semiconductor device of which reliability is improved and a manufacturing method of the same.

Another object of the present invention is to provide a semiconductor device of which dielectric breakdown strength is improved and a manufacturing method of the same.

Still another object of the present invention is to provide a semiconductor device of which mechanical strength is improved and a manufacturing method of the same.

In order to achieve an aspect of the present invention, the present invention provides a semiconductor device including an insulating layer, a conducting portion and a modified layer. The insulating layer is formed on a semiconductor substrate. The conducting portion is formed in the insulating layer. The modified layer is formed between the insulating layer and the conducting portion. The insulating layer includes hydrogenated polysiloxane. The modified layer is a layer to which the hydrogenated polysiloxane is modified.

In the semiconductor device of the present invention, a portion of the modified layer far from the semiconductor substrate is thicker than a portion of the modified layer near the semiconductor substrate.

In the semiconductor device of the present invention, a portion of the conducting portion far from the semiconductor substrate is thicker than a portion of the conducting portion near the semiconductor substrate.

In the semiconductor device of the present invention, the modified layer is a layer to which the hydrogenated polysiloxane is oxidized.

In the semiconductor device of the present invention, the hydrogenated polysiloxane includes at least one of a ladder type hydrogenated polysiloxane and a porous ladder type hydrogenated polysiloxane.

In the semiconductor device of the present invention, the conducting portion is a wiring, and the modified layer is formed to attach to a side of the wiring.

In the semiconductor device of the present invention, a portion of the conducting portion far from the semiconductor substrate is thicker than a portion of the conducting portion near the semiconductor substrate.

In the semiconductor device of the present invention, the conducting portion includes a first conducting portion and a second conducting portion. The first conducting portion is a bottom and side part of the conducting portion. The second conducting portion is a remaining part of the conducting portion, made form copper.

In order to achieve another aspect of the present invention, the present invention provides a manufacturing method of a semiconductor device, including: (a) forming an insulating film on a semiconductor substrate, wherein the insulating film includes hydrogenated polysiloxane; (b) etching the insulating film to form a trench, wherein an etching gas including a fluorocarbon gas and an oxidant gas is used for the etching; and (c) forming an interconnection in the trench.

In the manufacturing method of a semiconductor device of the present invention, the step (b) includes (b1) transforming a part of the insulating film to a modified layer by using the etching gas, wherein the part of the insulating film is in a side wall of the trench.

In the manufacturing method of a semiconductor device of the present invention, a portion of the modified layer far from the semiconductor substrate is thicker than a portion of the modified layer near the semiconductor substrate.

In the manufacturing method of a semiconductor device of the present invention, the oxidant gas includes at least one of $O_2$, CO and $CO_2$.

In the manufacturing method of a semiconductor device of the present invention, the fluorocarbon gas includes at least one of $CF_4$, $C_4F_8$, $C_5F_8$, $C_2F_6$, $CH_2F_2$ and $CHF_3$.

In the manufacturing method of a semiconductor device of the present invention, a portion of the modified layer far from the semiconductor substrate is thicker than a portion of the modified layer near the semiconductor substrate.

A semiconductor device including: a first insulating layer formed on a substrate; a trench formed in the first insulating layer; a conductive layer formed in the trench; and a second insulating layer formed between the first insulating layer and the conductive layer. The trench has a part which is wider than the other part. A thickness of the second insulating layer adjacent to the wider part is thicker than the other part.

In the semiconductor device of the present invention, the trench has a width which is wider at upper part than lower part, and a thickness of the second insulating layer adjacent to the upper part is thicker than a thickness of the second insulating layer adjacent to the lower part.

The semiconductor device according to the present invention includes the modified hydrogenated polysiloxane film as a part of the interlayer insulating film, of which the upper part is thicker than the lower part. As the mechanical strength of the modified hydrogenated polysiloxane film is higher than that of the original hydrogenated polysiloxane film, the mechanical strength is improved. As the dielectric constant of the modified hydrogenated polysiloxane film is larger than that of the original hydrogenated polysiloxane film, the dielectric breakdown strength is improved.

DESCRIPTION OF THE PREFERRED EMBODIMENTS

An embodiment of a semiconductor device according to the present invention will be described below with reference to the attached drawings.

Figure 1:
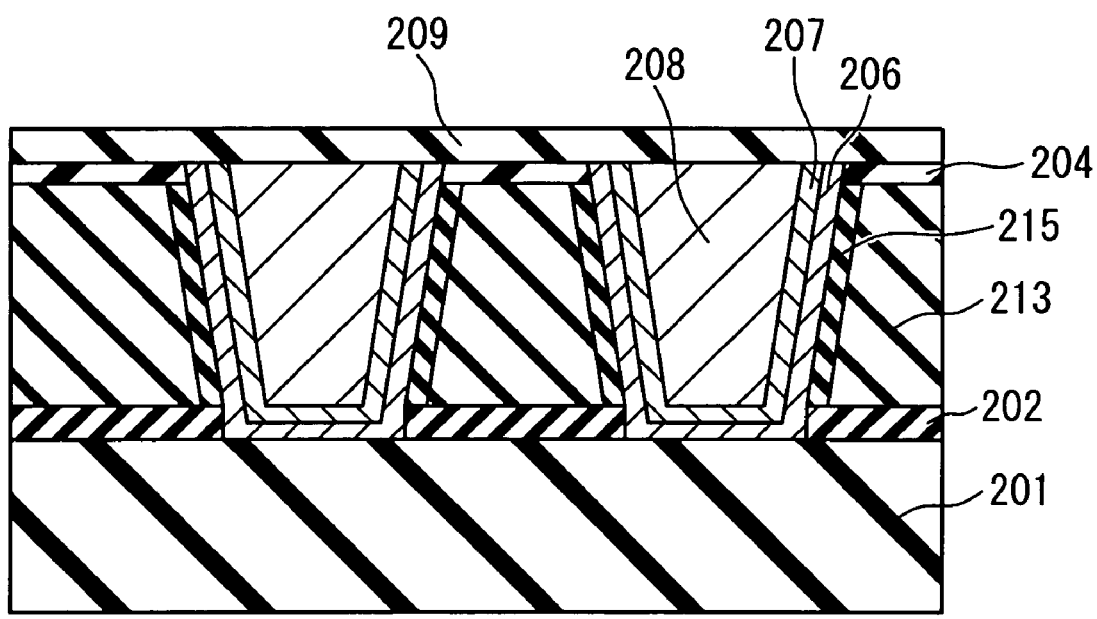
FIG. 1 is a cross sectional view showing a conventional semiconductor device.
Figure 2A:
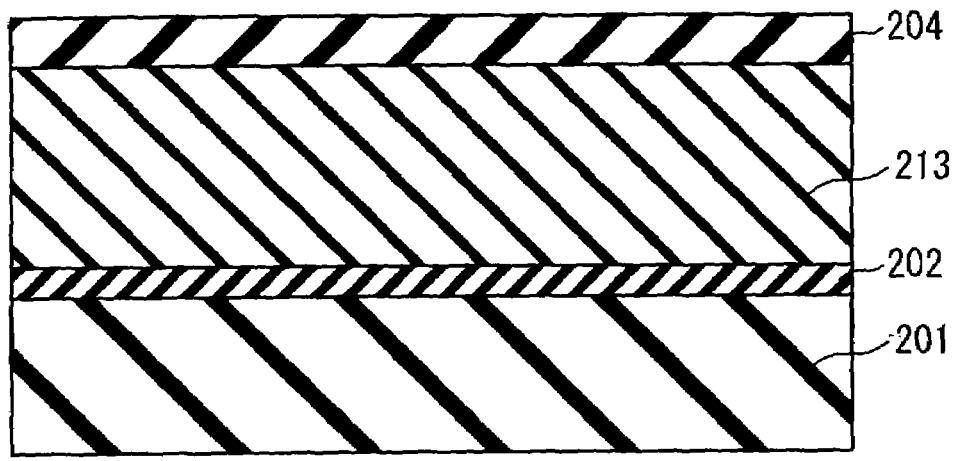
FIGS. 2A to 2C and FIGS. 3A and 3B are the cross sectional views showing a procedure of the conventional manufacturing method of the semiconductor device.
Figure 2B:
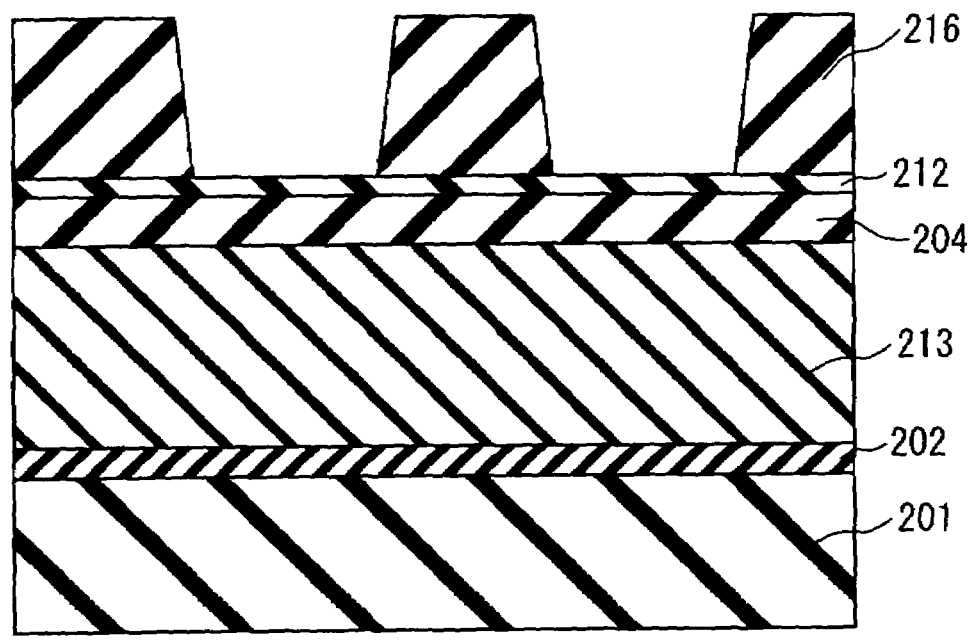
Figure 2C:
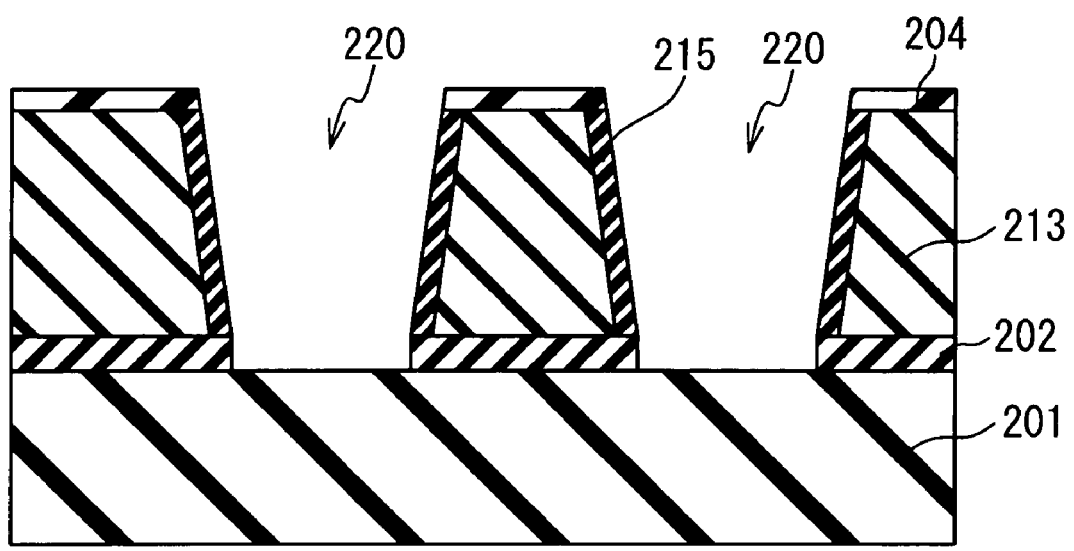
Figure 3A:
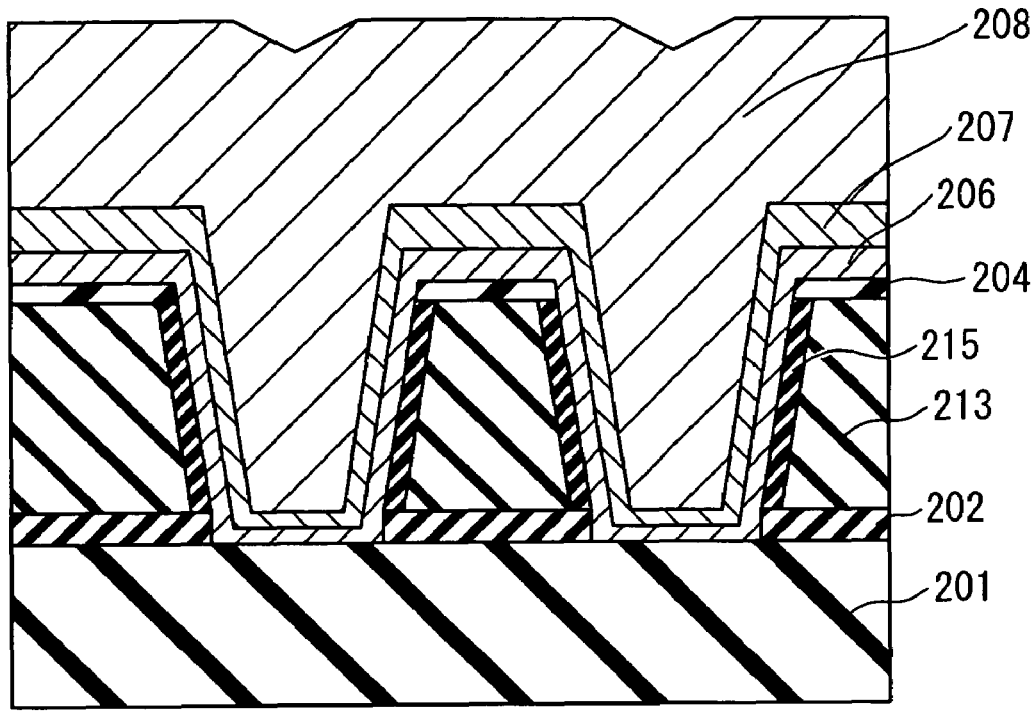
Figure 3B:
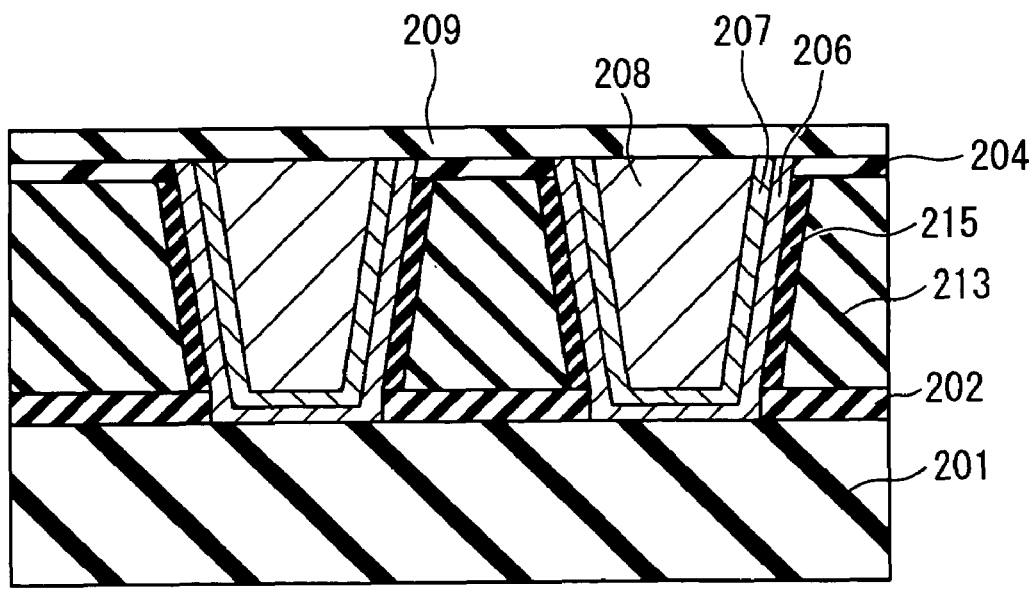
Figure 4:
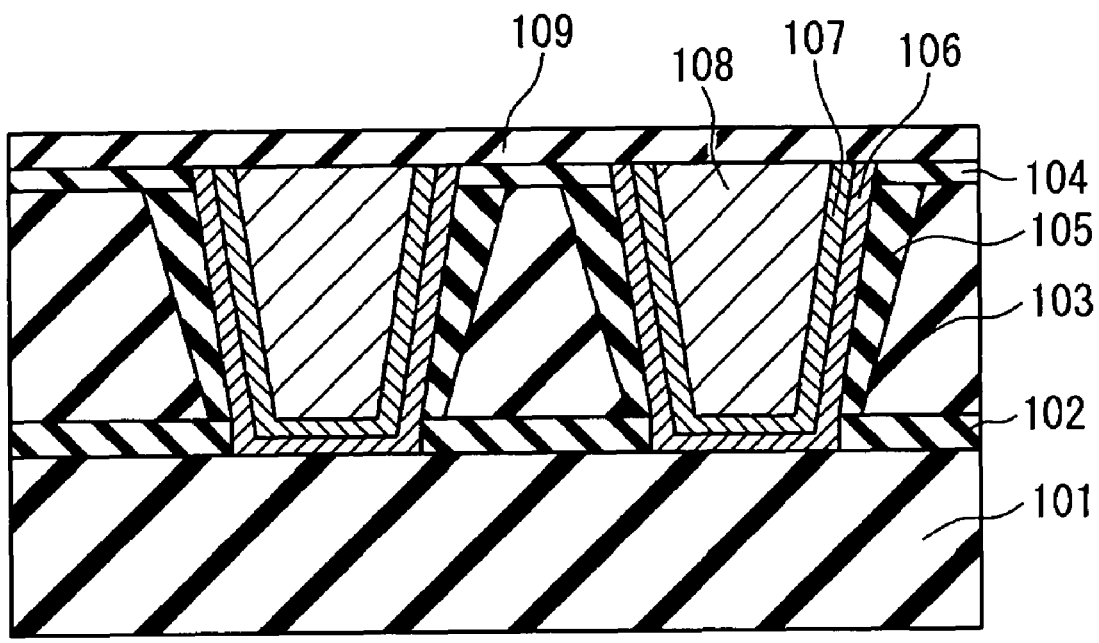
FIG. 4 is a cross sectional view showing an embodiment of a semiconductor device according to the present invention.

FIG. 4 is a cross sectional view showing an embodiment of a semiconductor device according to the present invention. Here, an insulating film made from ladder type hydrogenated polysiloxane (L-Ox: Ladder-Oxide, a trade mark), one of hydrogenated polysiloxanes, is shown as an example for a low dielectric constant interlayer insulating film.

In FIG. 4, a first SiCN film 102 is formed as a barrier insulating film on an insulating film 101 formed on a semiconductor substrate that includes transistors. An interlayer insulating film 103, which is the ladder type hydrogenated polysiloxane film, is formed on the first SiCN film 102. A $SiO_2$ film 104 is formed on the interlayer insulating film 103. The trenches for the interconnections are formed through the first SiCN film 102, the interlayer insulating film 103 and the $SiO_2$ film 104. A modified insulating film 105 is formed in the side wall of the trench in the interlayer insulating film 103.

The modified insulating film 105 is formed on the surface of the trench. The modified insulating film 105 is characterized by that the film thickness of the upper part is thicker than that of the lower part.

A TaN film 106 is formed as one of barrier metals on the inner surface of the trench, close against the modified insulating film 105. A Ta film 107 is formed as another barrier metal on the TaN film 106. A Cu film 108 is formed on the Ta film 107 such that the Cu film 108 fill up the trench. The interconnection is composed of the TaN film 106, the Ta film 107 and the Cu film 108. A second SiCN film 109 is formed as a barrier insulating film on the $SiO_2$ film 104 and the interconnections.

Here, the trench for interconnection is illustrated. However, repetition to form a via on the trench and another interconnection on the via enables to form the multilayer interconnections.

The trench has taper shape, the width of the upper part tends to be wider than that of the lower part. Therefore, if the modified insulating film 105 is not provided, the interval between the interconnections of the upper part is closer than that of the lower part. This causes that the electric field tends to be concentrated on the upper part of the trench. However, the upper part of the modified insulating film 105 is thicker than the lower part. The modified insulating film 105 includes smaller amount of carbon element than the interlayer insulating film 103 made from the hydrogenated polysiloxane and its composition is close to $SiO_2$. Therefore, the modified insulating film 105 is superior to the interlayer insulating film 103 in its dielectric characteristics. Hence, the dielectric characteristics will be improved.

The etching rate by buffered hydrogen fluoride of the modified insulating film 105 solution is faster than that of the interlayer insulating film 103. It is easy to confirm the modified insulating film 105 and the interlayer insulating film 103 by observing the SEM cross sectional view of the semiconductor device after the etching.

Next, an embodiment of a manufacturing method of the semiconductor device will be described with reference to the drawings. FIGS. 5A to 5D and FIGS. 6A and 6B are the cross sectional views showing an embodiment of a procedure of the manufacturing method of the semiconductor device according to the present invention.

Figure 5A:
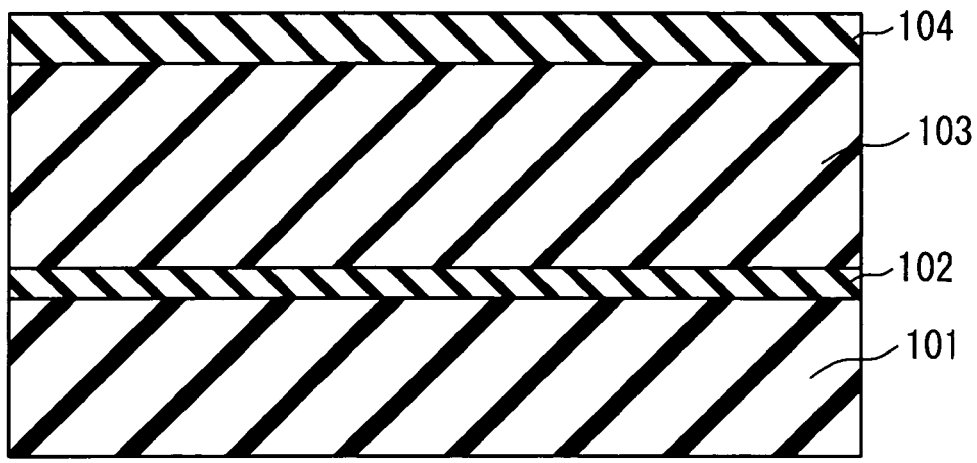
FIGS. 5A to 5D and FIGS. 6A and 6B are the cross sectional views showing an embodiment of a procedure of the manufacturing method of the semiconductor device according to the present invention.

Firstly, As shown in FIG. 5A, the first SiCN film 102 is formed by using the plasma CVD method on the insulating film 101 formed on a semiconductor substrate having semiconductor elements such as transistors. The thickness of the first SiCN film 102 is 50 nm to 100 nm. Next, the material of the interlayer insulating film 103 is coated and baked on the first SiCN film 102 such that the interlayer insulating film 103 is formed with the film thickness of 150 nm to 350 nm. Then, the $SiO_2$ film 104 with the thickness of 50 nm to 200 nm is formed by using the plasma CVD method on the interlayer insulating film 103.

Figure 5B:
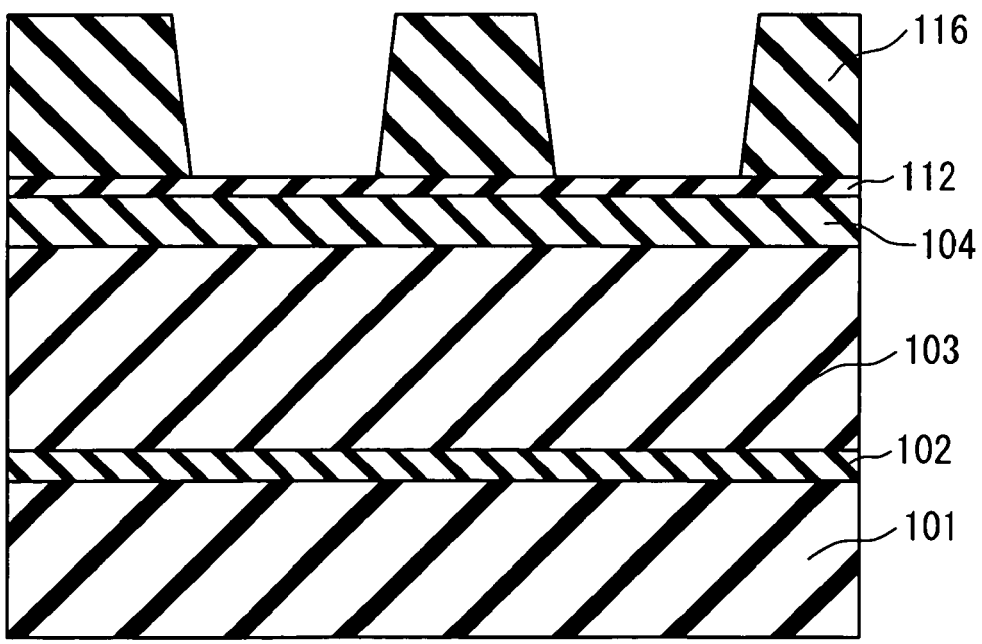

Next, as shown in FIG. 5B, an ARC (anti-reflection coating) film 112 is coated on the $SiO_2$ film 104. Then, the photoresist mask 116 patterned by using the photolithography technique with the level of L/S=0.14 micrometer/0.14 micrometer.

Figure 5C:
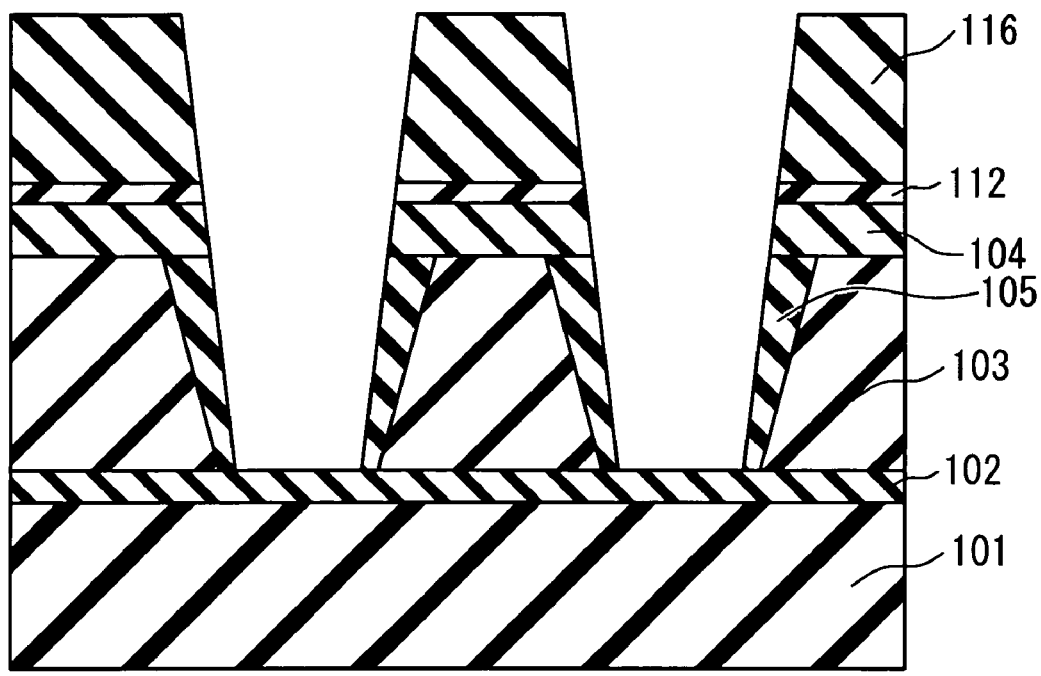

After that, as shown in FIG. 5C, the dry etching processing is carried out to ARC film 112, the $SiO_2$ film 104 and the interlayer insulating film 103 through the photoresist mask 116 by using gas including $C_4F_8$ gas and $O_2$ gas. The dry etching is stopped at the surface of the first SiCN film 102. Next, the photoresist mask 116 is removed by using oxygen plasma ashing processing. After that, residual is completely removed by using the weak alkaline organic remover with amine related material.

Figure 5D:
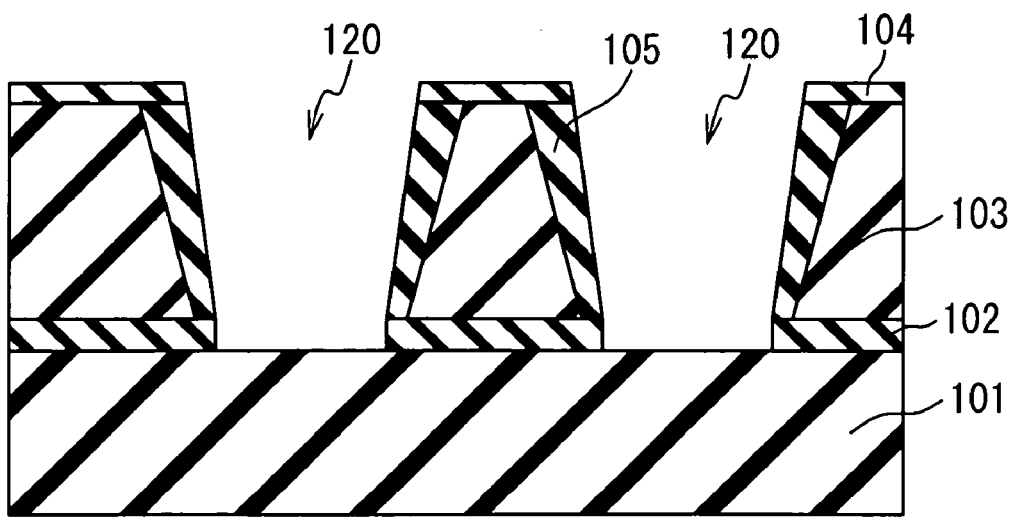

Then, as shown in FIG. 5D, the first SiCN film 102 is etched back to be removed. As a result, the trench 120 is formed in the $SiO_2$ film 104, the interlayer insulating film 103 and the first SiCN film 102. In this procedure, the modified insulating film 105 is formed on the side wall of the trench 120. The modified insulating film 105 is formed such that the film thickness of the upper part is thicker than that of the lower part. Here, the film thickness of the most upper part is approximately 30 nm, and the most lower part is approximately 10 nm.

Figure 6A:
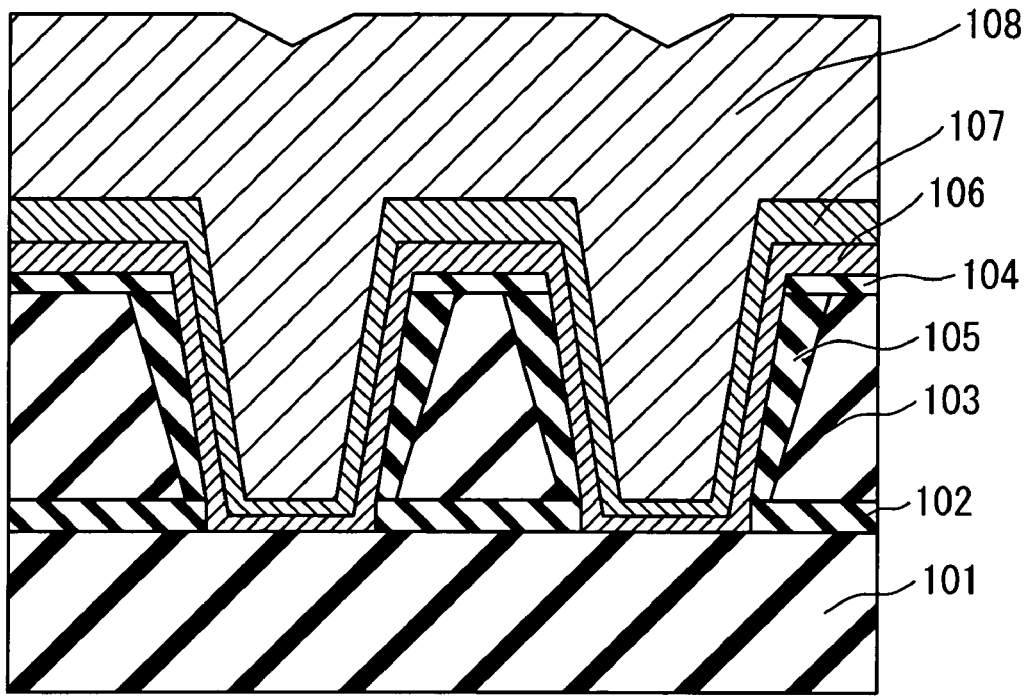

Next, as shown in FIG. 6A, after the outgassing processing and the RF etching processing by using Ar ions are carried out, the TaN film 106 with the thickness of 10 nm is formed as one of barrier metals on the inner surface of the trench 120. The Ta film 107 with the thickness of 20 nm is formed as another barrier metal on the TaN film 106. After that, the Cu seed film (not shown) with the thickness of 100 nm is formed on the Ta film 107. Next, the Cu film 108 with the thickness of 600 nm is formed on the Cu seed film by using Cu metal plating. Then, the semiconductor device is annealed in the furnace in the temperature range of 200 to 400 degree Celsius.

Figure 6B:
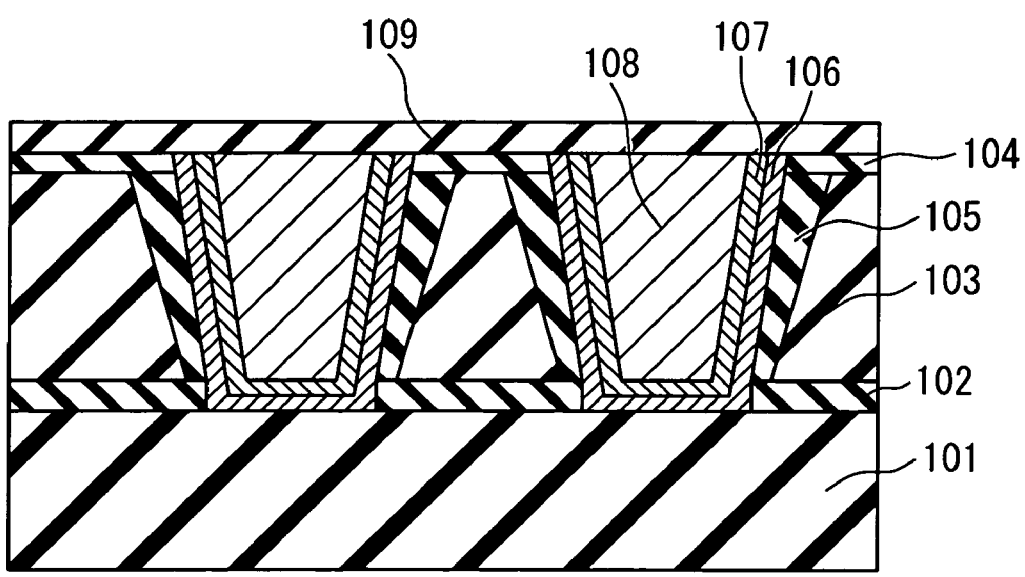

After that, as shown in FIG. 6B, the metals (the TaN film 106, the Ta film 107 and the Cu film 108) are removed except for those in the trench 120 by using CMP (chemical mechanical polishing) technique. Then, the second SiCN film 109 with the thickness of 50 to 100 nm is formed by using the plasma CVD method on the $SiO_2$ film 104 and the interconnections.

The shape of the modified insulating film 105, of which the upper part is thicker than the lower part, is realized by etching the interlayer insulating film 103 by using an etching gas including at least fluorocarbon gas and oxidant gas. including $C_4F_8$ gas and $O_2$ gas. Addition of the oxidant gas to the etching gas, the interlayer insulating film 103 is oxidized to be the modified insulating film 105 during the dry etching. The upper part becomes thicker because the upper part is exposed to oxygen (ex. oxygen ion, oxygen radical) more directly for a longer time.

On the above description, $C_4F_8$ gas is used as the fluorocarbon gas. The gas including at least one of $CF_4$, $C_4F_8$, $C_5F_8$, $C_2F_6$, $CH_2F_2$ and $CHF_3$ may be used as the fluorocarbon gas and the above-mentioned same result can be obtained. On the above description, $O_2$ gas is used as the oxidant gas. The gas including at least one of $O_2$, CO and $CO_2$ may be used as the oxidant gas and the above-mentioned same result can be obtained.

Figure 7:
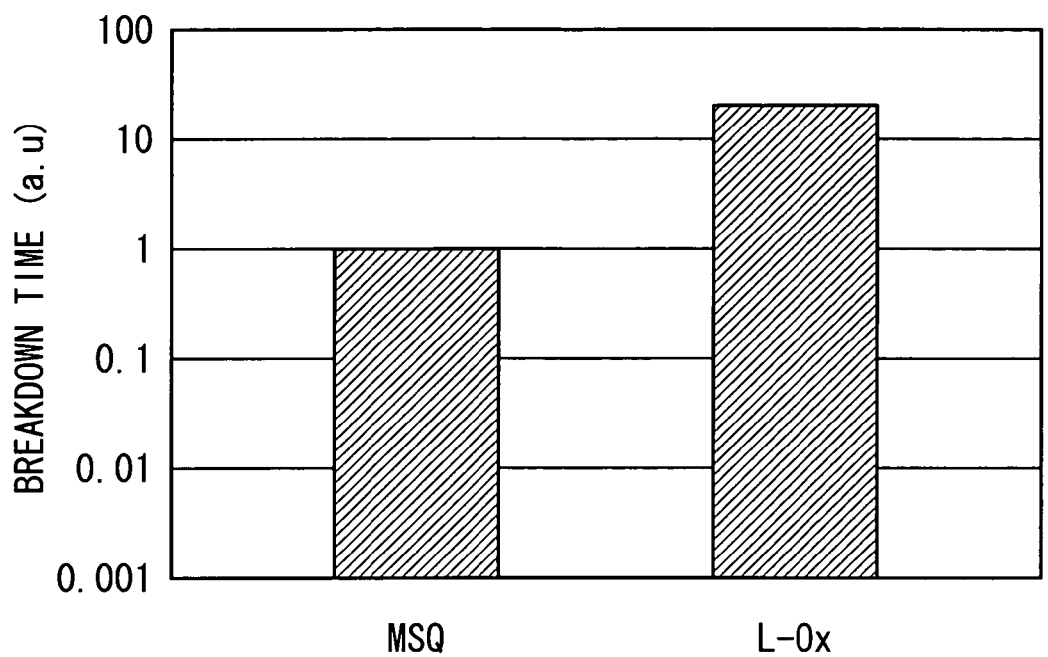
FIG. 7 is a graph showing dielectric breakdown strength of the interlayer insulating film of the same layer.

FIG. 7 is a graph showing dielectric breakdown of the interlayer insulating film between the interconnections of the same layer. The vertical axis shows the breakdown time (a. u.), "MSQ" shows the MSQ film as the interlayer insulating film according to the conventional technique, "L-Ox" shows the ladder type hydrogenated polysiloxane film as the interlayer insulating film according to the present invention. The breakdown time is measured under the interconnections' interval of 0.14 micrometer, the electric field of 2 MV/cm and the temperature of 125 degree Celsius.

As shown in FIG. 7, in case that the breakdown time of the conventional technique was one (1), the breakdown time of the present invention was improved to 22 (twenty two). This is because the upper part of the modified insulating film 105 is thicker than the lower part. The interconnection has taper shape, the width of the upper part tends to be wider than that of the lower part. Therefore, the interval between the interconnections of the upper part is closer than that of the lower part. This causes that the electric field tends to be concentrated on the upper part of the interconnection. However, the dielectric constant of the modified insulating film 105 is higher than that of interlayer insulating film 103 of the hydrogenated polysiloxane film and closer to that of SiO2. Therefore, the modified insulating film 105 can release the concentration of the electric field. The fact that the upper part of the modified insulating film 105 is thicker than the lower part is also important point to release the concentration. Here, the ladder type hydrogenated polysiloxane with k (specific dielectric constant)=2.9 is used for the interlayer insulating film. It was also confirmed that a porous ladder type hydrogenated polysiloxane with k=2.4 has similar advantage in the dielectric breakdown to a porous MSQ film with a similar specific dielectric constant, from another experiment.

Figure 8:
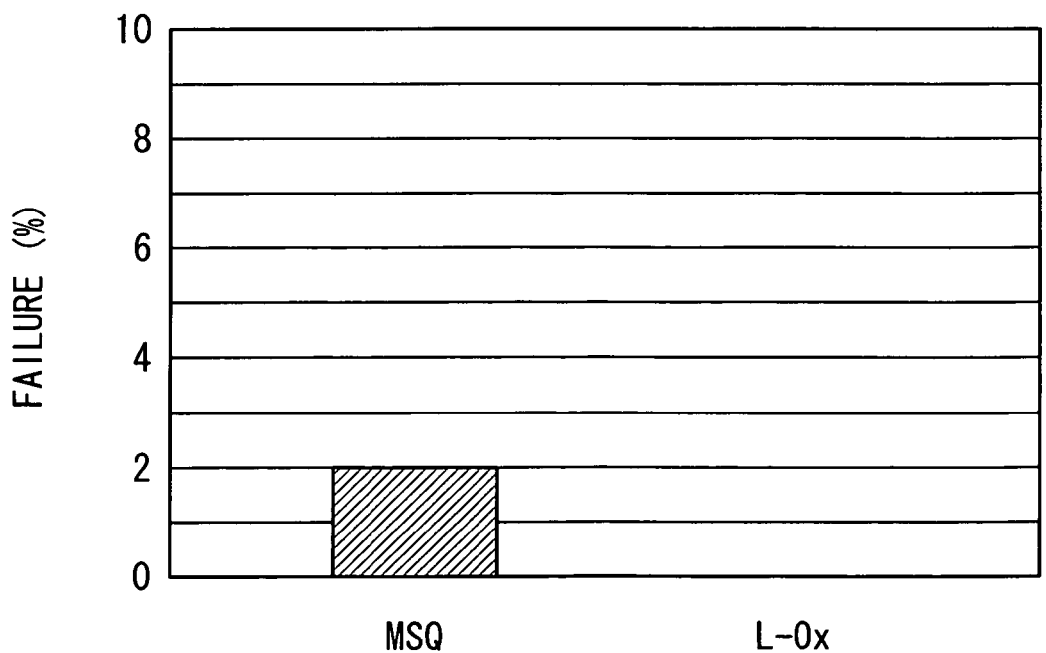
FIG. 8 is a graph showing the failure of the bonding processing for the semiconductor device with the five-layer interconnection.

FIG. 8 is a graph showing the failure of the bonding processing for the semiconductor device with the five-layer interconnection. The vertical axis shows the failure (%), "MSQ" shows the MSQ film as the interlayer insulating film according to the conventional technique, "L-Ox" shows the ladder type hydrogenated polysiloxane film as the interlayer insulating film according to the present invention.

As shown in FIG. 8, the defectives were generated in the rate of 2% in case of using the MSQ film. On the other hand, the defectives were not generated in case of using the hydrogenated polysiloxane film. The defects were generated at the boundary between the upper part of interconnection and the SiCN film. It is suggested that the mechanical load is concentrated to the upper part of the interconnection. The mechanical strength of the MSQ film is similar to that of the hydrogenated polysiloxane film. Therefore, it is supposed that the difference of the defect generation between the conventional technique and the present invention is caused by the difference between the MSQ modified film (215) and the modified insulating film (105).

As the modified insulating film (105) is superior in its mechanical strength to the interlayer insulating film (103) and its upper part is thicker than that of the MSQ modified film (215), the semiconductor device of the present invention has the resistance property to the bonding processing.

In case of adding the oxidant gas to the fluorocarbon gas as the etching gas for etching the MSQ film of the conventional technique, the trench tend to be a bowing shape remarkably that is not desirable. This may be because the carbons of the methyl radicals in the MSQ film is drawn out by the oxidant gas and the MSQ film is constricted rapidly.

On the other hand, in case of the interlayer insulating film of the ladder type hydrogenated polysiloxane film, adding the oxidant gas to the fluorocarbon gas enables the shape of the trench to be stable. The interlayer insulating film is not constricted rapidly and the hydorgen in the film is oxidized, by the oxidant gas. Therefore, the part of the interlayer insulating film is modified to the modified insulating film similar to the $SiO_2$. In the procedure after the dry etching, as this modified insulating film is worked as a protect film, the trench shape is stable. If the oxidant gas is not used, the dry etching can not be proceeded because the deposition film may be deposited on the etching surface.

The present invention is not limited to this embodiment.

It is further understood by those skilled in the art that the foregoing description is a preferred embodiment of the disclosed device and that various changes and modifications may be made in the invention without departing from the spirit and scope thereof.

The present invention enables to avoid the film peeling in the processing with the heavy load such as the CMP processing, and the defectives caused by the bonding in the chip assembly processing.

What is claimed is:

1. A semiconductor device comprising:
   an insulating layer on a semiconductor substrate;
   a conducting portion in said insulating layer; and
   a modified layer between said insulating layer and said conducting portion,
   wherein said insulating layer includes hydrogenated polysiloxane, and wherein said modified layer is a layer of modified hydrogenated polysiloxane.

2. The semiconductor device according to claim 1, wherein said modified layer tapers in thickness so that a portion of said modified layer far from said semiconductor substrate is thicker than a portion of said modified layer near said semiconductor substrate.

3. The semiconductor device according to claim 2, wherein said conducting portion tapers in width so that a portion of said conducting portion far from said semiconductor substrate is wider than a portion of said conducting portion near said semiconductor substrate.

4. The semiconductor device according to claim 1, wherein said modified layer is a layer of oxidized hydrogenated polysiloxane.

5. The semiconductor device according to claim 1, wherein said hydrogenated polysiloxane includes at least one of a ladder type hydrogenated polysiloxane and a porous ladder type hydrogenated polysiloxane.

6. The semiconductor device according to claim 1, wherein said conducting portion is a wiring, and said modified layer is attached to a side of said wiring.

7. The semiconductor device according to claim 6, wherein a portion of said conducting portion far from said semiconductor substrate is thicker than a portion of said conducting portion near said semiconductor substrate.

8. The semiconductor device according to claim 6, wherein said conducting portion includes:
   a first conducting portion which is a bottom and side part of said conducting portion, and
   a second conducting portion which is a remaining part of said conducting portion, made from copper.

9. A manufacturing method of a semiconductor device, comprising the steps of:
   (a) forming an insulating film on a semiconductor substrate, wherein said insulating film includes hydrogenated polysiloxane;
   (b) etching said insulating film to form a trench, wherein an etching gas including a fluorocarbon gas and an oxidant gas is used for said etching;
   (c) forming an interconnection in said trench.

10. The manufacturing method of a semiconductor device according to claim 9, wherein said step (b) includes:
    (b1) transforming a part of said insulating film to a layer of modified hydrogenated polysiloxane by using said etching gas, wherein said part of the insulating film is in a side wall of said trench.

11. The manufacturing method of a semiconductor device according to claim 10, wherein the modified layer tapers in width so that a portion of said modified layer far from said semiconductor substrate is thicker than a portion of said modified layer near said semiconductor substrate.

12. The manufacturing method of a semiconductor device according to claim 11, wherein said oxidant gas includes at least one of $O_2$, CO and $CO_2$.

13. The manufacturing method of a semiconductor device according to claim 11, wherein said fluorocarbon gas includes at least one of $CF_4$, $C_4F_8$, $C_5F_8$, $C_2F_6$, $CH_2F_2$ and $CHF_3$.

14. A semiconductor device comprising:
    a first insulating layer on a substrate;
    a trench in said first insulating layer;
    a conductive layer in said trench; and
    a second insulating layer between said first insulating layer and said conductive layer,
    wherein said trench has a first part which is wider than a second part, and
    a thickness of said second insulating layer tapering from said wider part of said trench to the other part of said trench so that said second insulating layer adjacent to said first part is thicker than adjacent to said second part.

15. The semiconductor device according to claim 14, wherein said first part is an upper part of said trench and said second part is a lower part of said trench.

16. A semiconductor device comprising:
    a first layer of dielectric material on a substrate;
    a trench in said first layer, said trench having side walls that are oblique to a surface of said first layer;
    a conductor in said trench; and
    a modified layer between said conductor and said first layer, said modified layer being a modified form of the dielectric material of said first layer, said modified layer having a tapered thickness so that an interface between said modified layer and said first layer is at a different angle to the surface of said first layer than said side walls of said trench.

17. The device of claim 16, further comprising a barrier metal nitride between said conductor and said modified layer.

18. The device of claim 16, wherein the dielectric material is hydrogenated polysiloxane and said modified layer is an oxidized form of hydrogenated polysiloxane.

* * * * *